United States Patent
Kahlert et al.

(10) Patent No.: US 6,621,639 B2
(45) Date of Patent: Sep. 16, 2003

(54) DEVICE FOR CONVERTING THE INTENSITY DISTRIBUTION OF A LASER BEAM AND A DEVICE AND METHOD FOR GENERATING A LASER BEAM WITH AN INTENSITY WHICH FALLS CONSTANTLY ALONG AN AXIS FROM ONE SIDE OF THE BEAM TO THE OTHER

(75) Inventors: Hans-Jürgen Kahlert, Göttingen (DE); Berthold Burghardt, Waake (DE)

(73) Assignee: Microlas Lasersystem GmbH, Goettingen (DE)

( * ) Notice: Subject to any disclaimer, the term of this patent is extended or adjusted under 35 U.S.C. 154(b) by 32 days.

(21) Appl. No.: 09/960,801

(22) Filed: Sep. 21, 2001

(65) Prior Publication Data

US 2002/0041444 A1 Apr. 11, 2002

(30) Foreign Application Priority Data

Oct. 6, 2000 (DE) .......................... 100 49 557

(51) Int. Cl.$^7$ .............................................. G02B 27/10
(52) U.S. Cl. ..................... 359/622; 359/626; 359/719
(58) Field of Search ................. 359/622, 628, 359/626, 668, 671, 708, 719, 618, 619; 372/108

(56) References Cited

U.S. PATENT DOCUMENTS 5,796,521 A    8/1998  Kahlert et al. .............. 359/619
6,002,523 A  * 12/1999 Tanaka ........................ 359/668
6,016,227 A  *  1/2000 Hopkins et al. ............. 359/668
6,246,524 B1 *  6/2001 Tanaka ........................ 359/619

FOREIGN PATENT DOCUMENTS

DE    42 20 705 A1   6/1992   .......... H01S/3/10
DE    196 32 460 C1  8/1996   .......... G02B/27/09
DE    199 15 000 A1  4/1999   .......... G02B/27/09

* cited by examiner

Primary Examiner—Loha Ben
Assistant Examiner—M. Hasan
(74) Attorney, Agent, or Firm—Stallman & Pollock LLP

(57) ABSTRACT

A device is obtained for converting the intensity distribution of a laser beam in particular into an intensity distribution which falls constantly along an axis from one side to the other in that a homogenizer (10), which mutually superimposes the sub-beams of the laser beam such that when a laser beam with a specific intensity distribution passes through the homogenizer, a homogenization of the intensity distribution of the laser beam is promoted, is combined with at least one inverter (24, 26) which inverts the intensity distribution of a sub-region, in particular a sub-beam or a plurality of adjacent sub-beams, along at least one axis along which the intensity is to be converted. The extent of the fall in intensity from one side to the other can be controlled by means of the number of the inverters.

25 Claims, 7 Drawing Sheets

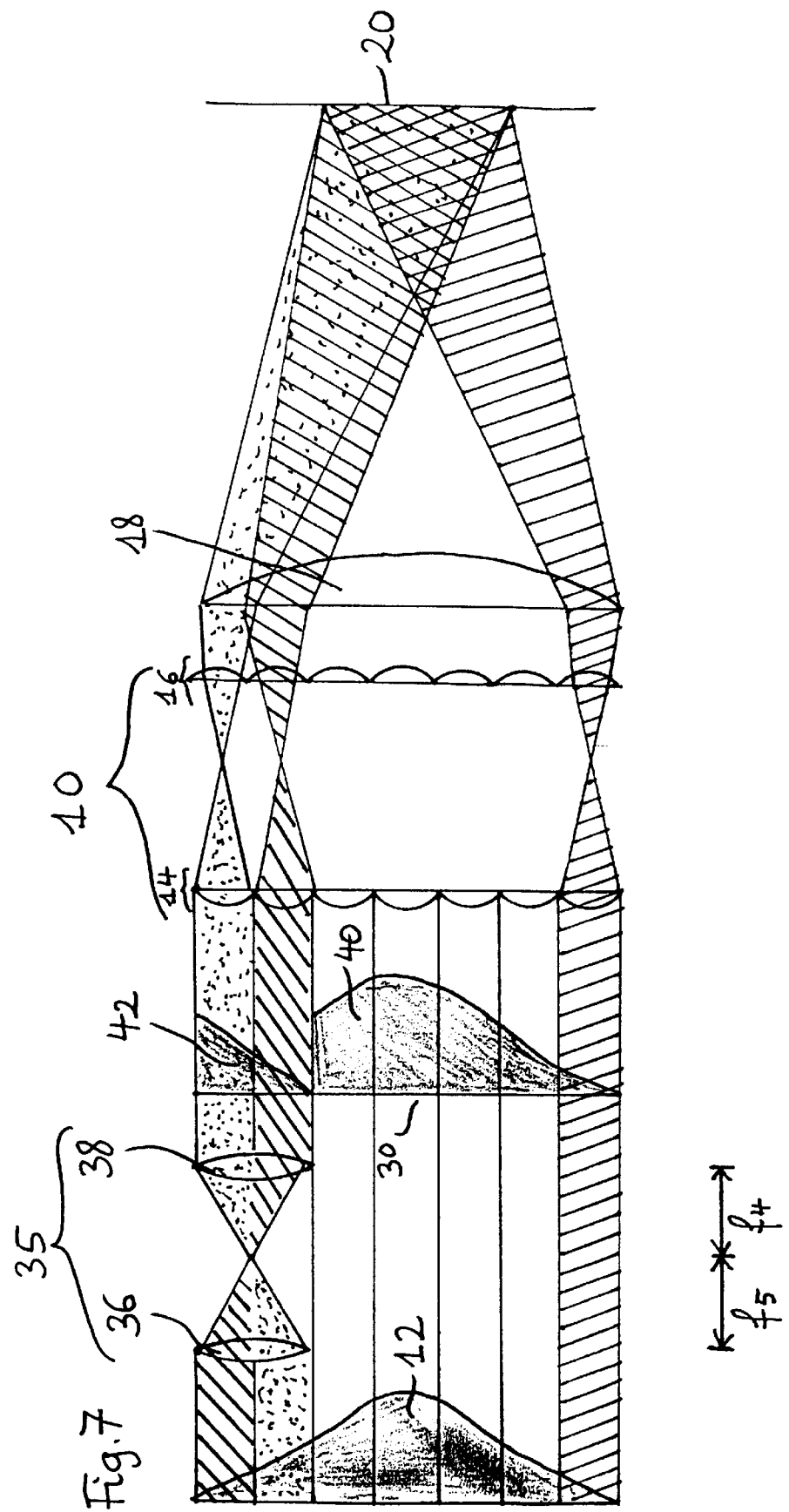

DEVICE FOR CONVERTING THE INTENSITY DISTRIBUTION OF A LASER BEAM AND A DEVICE AND METHOD FOR GENERATING A LASER BEAM WITH AN INTENSITY WHICH FALLS CONSTANTLY ALONG AN AXIS FROM ONE SIDE OF THE BEAM TO THE OTHER

This application claims the benefit of German application no. 100 49 557.5 filed Oct. 6, 2000.

BACKGROUND OF THE INVENTION

1. Field of the Invention

The invention relates to a device for converting the intensity distribution of a laser beam wherein the device is particularly suitable for generating a laser beam with an intensity which falls constantly along a transverse axis from one side of the beam to the other.

In the present application constant fall (or constant rise) in intensity is not to be considered as a mathematically strictly monotonous fall (or monotonous rise) but as a change in intensity on a scale which is of technical significance for the use of the laser beam, i.e. intensity fluctuations over smaller regions can exist but these are of no importance to the technical outcome in the use of the laser beam and in no way alter the basic tendency of the change in the intensity distribution.

2. Description of the Related Art

In numerous applications of lasers it is desirable to use a laser beam which has an inhomogeneous beam distribution. For example lasers can be used for the recrystallisation of amorphous Si—layers by passing a laser beam over substrates containing these layers. For a homogeneous recrystallisation it has proved adcantageous for the leading edge of the passing laser beam to possess an increased intensity compared to the following part of the laser beam.

In the prior art it is known to control the intensity distribution of a laser beam by extracting parts thereof. For example DE 199 15 000 has disclosed a device wherein sub-beams of the laser beam are mutually superimposed such that a homogenisation of the intensity distribution of the laser beam is fundamentally promoted, but in the case of those sub-beams which are not completely mutually superimposed a diaphragm in the beam path of the laser beam extracts different components. Laser beam power is always lost upon the extraction of parts of the laser beam.

BRIEF SUMMARY OF THE INVENTION

The object of the present invention is to provide a device with which it is possible to generate an intensity profile of the laser beam which, transversely to the laser beam direction, has a higher intensity on one side of the beam than in other regions of the beam. In particular the laser beam power irradiated into the device is to be utilized in as loss-free a manner as possible.

The object is achieved by a device for converting the intensity distribution of a laser beam with
- a homogenizer which mutually superimposes sub-beams of the laser beam such that when a laser beam passes through the homogenizer, a homogenization of the intensity distribution of the laser beam is promoted and
- at least one inverter which inverts the intensity distribution at least of one sub-region of the laser beam in the direction transverse to the direction of the laser beam.

Here inversion of intensity along an axis or in a direction is to be understood in that the sequence of the intensity values of the sub-region is exactly reversed from one side of the sub-region to the other. If for example the sub-region has an intensity a at the left-hand margin (here the orientation has been selected at random), an intensity b in the centre, and an intensity c at the right-hand margin, the inverted sub-region has the intensity c at the left-hand margin, the intensity b in the centre, and the intensity a at the right-hand margin.

A homogenizer as used in the device according to the invention is known for example from DE 42 20 705 A1 wherein the intensity distribution of a laser beam is homogenized (spatially adjusted) in that a plurality of lenses are arranged in a row at right angles to the optical axis. These lenses are each shaped such that they mutually superimpose individual sub-beams of the laser beam such that the total focused laser radiation is substantially homogenized.

A further development of such a homogenizer is described in DE 196 32 460 C1 wherein a plurality of illuminating fields, each having a homogeneous intensity distribution, are generated, and wherein a row of lenses comprises a plurality of different groups of acentric lens segments of cylindrical lenses (see also U.S. Pat. No. 5,796,521).

In accordance with an advantageous development of the device according to the invention, the inverter consists of two converging lenses with the focal lengths $f_5$ and $f_4$, which are spaced from one another by the distance $f_5+f_4$ in the direction of the beam propagation, i.e. in a telescopic arrangement.

As is known, a converging lens is sufficient to invert an intensity distribution. (A converging lens forms an object on a screen arranged behind its focal point upside down). The second converging lens provides that beams impinging in parallel on the first converging lens also issue from the inverter in parallel in the direction of the beam propagation.

Preferably the inverter is arranged in front of the homogenizer in the direction of the beam propagation (on the beam axis).

Preferably the sub-region of the laser beam which is inverted by the inverter is one of the sub-beams of the laser beam which is (subsequently) superimposed by the homogenizer. The inverter can also invert a group of two or more adjacent sub-beams which are (subsequently) superimposed by the homogenizer. If for example the one sub-beam has an intensity a at the left-hand margin (here again the orientation has been selected at random), an intensity b in the centre and an intensity c at the right-hand margin, and the adjacent sub-beam has the intensity c at the left-hand margin, an intensity d in the centre and an intensity e at the right-hand margin, following the inversion the sub-region has the intensity e at the left-hand margin, then the intensity d, then the intensity c, then the intensity b and at the right-hand margin has the intensity a.

It is also possible to provide two inverters which each invert one sub-region or sub-beam. Then, in the above example of the adjacent sub-beams, following the inversion one does not obtain an intensity curve extending from the intensity e to the intensity a, but rather the first sub-beam is inverted independently of the adjacent sub-beam so that following the inversion of the two sub-beams, the sub-region has the intensity c at the left-hand margin, then the intensity b and then the intensity a, from which the intensity jumps to the intensity e, whereupon further to the right the sub-region has the intensity d and at the right-hand margin again has the intensity c.

The above described invention combines a known homogenizer with an additional inverter.

In accordance with an alternative embodiment of the invention, a known homogenizer can be extended such that, as previously, the sub-beams passing through said homogenizer are mutually superimposed but at least one of the sub-beams is inverted once (or three times, five times etc.) more than the other sub-beams.

Thus a variant of the invention relates to a device for converting the intensity distribution of a laser beam comprising a plurality of optical appliances and a converging lens arranged behind them, which are selected and arranged such that each optical appliance focuses one sub-beam of the laser beam, and that having passed through the device the sub-beams are mutually superimposed, which device is characterised in that at least one of the optical appliances is designed such that along at least one axis, along which the intensity is to be converted, it inverts the associated sub-beam once more than the other optical appliances invert their associated sub-beams.

For example, the optical appliances generally each comprise one pair of lenses and the optical appliances which invert the associated sub-beam once more than the other optical appliances comprise two pairs of lenses. Of these pairs of lenses, one pair can consist of two converging lenses with the focal lengths $f_5$ and $f_4$ which are spaced from one another by the distance $f_5+f_4$ in the direction of the beam propagation. The second pair of lenses of this optical appliance then for example has focal lengths which are smaller than in the case of the other optical appliances so that sufficient space is available for the two pairs of lenses.

The forementioned devices according to the two alternative embodiments can be extended by combination with a laser beam source, which generates a laser beam with an intensity distribution which satisfies specific requirements, to form a device for generating a laser beam with an intensity which falls constantly from one side to another along an axis extending transversely to the beam direction.

In accordance with the invention, a device of this kind comprises:

a laser beam source which generates a laser beam in which the intensity in selected sub-beams of the laser beam rises constantly along the axis from one side of the selected sub-beams or sub-regions to the other side thereof, a least one inverter which inverts the intensity distribution at least of one of the selected sub-beams or sub-regions along the axis and a homogenizer which mutually superimposes sub-beams of the laser beam such that the laser beam would be homogenized if none of its sub-beams were to pass through the inverter.

It is possible for the homogenizer to invert the sub-beams once again. In this case the roles of the "one" side and the "other" side of the sub-beam relative to the "one" side and the "other" side of the generated total beam are transposed.

Advantageously, the laser beam source generates a laser beam whose intensity distribution firstly rises constantly to a maximum from one side (or edge or margin) of the laser beam along the transverse axis and falls constantly from the maximum towards the other side. In this case the inverter(s) is/are advantageously arranged such that an inversion takes place only of sub-regions or sub-beams on one side of the maximum. Typically the laser beam source is an excimer laser beam source which generates a symmetrical intensity distribution which in particular is bell-shaped along one of the axes. (Along the other axis the intensity distribution in excimer lasers is generally more or less homogeneous).

The invention further relates to a method of generating a laser beam with an intensity distribution which falls constantly along an axis from one side to the other, comprising the following steps:

irradiation of a laser beam in which the intensity distribution in selected sub-regions or sub-beams of the laser beam rises constantly along the axis from one side of the selected sub-regions or sub-beams to the other side thereof, inversion at least of one of the selected sub-regions/sub-beams along the axis, passage of the laser beam through a homogenizer which mutually superimposes sub-beams of the laser beam such that without the step of the inversion at least of one of the selected sub-regions/sub-beams, a homogenization of the intensity distribution would be promoted.

Advantageously, the step of the inversion of the at least one of the selected sub-beams takes place (temporally and spatially) before the passage of the laser beam through the homogenizer.

The extent of the fall in the intensity distribution increases with the number of inverted sub-regions or sub-beams, and thus can be controlled by the number of inverted sub-beams.

BRIEF DESCRIPTION OF THE DRAWINGS

In the following, exemplary embodiments of the invention will be described in detail making reference to the drawing in which:

FIG. 7 illustrates a second embodiment of the device according to the invention for converting the intensity distribution of a laser beam comprising a homogenizer such as that shown in FIG. 1 and an inverter for two adjacent sub-beams.

DETAILED DESCRIPTION OF THE PREFERRED EMBODIMENTS

Figure 1:
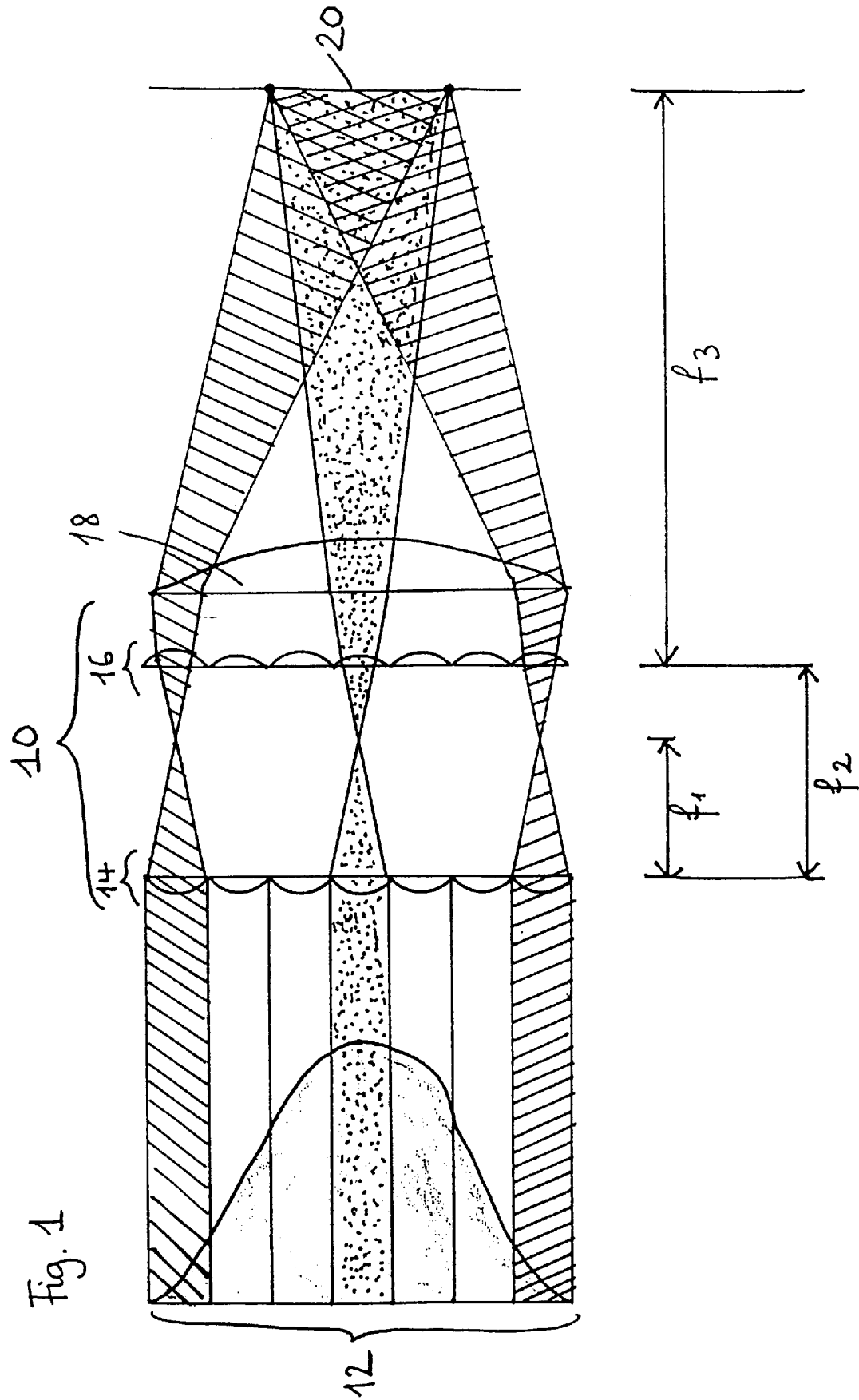
FIG. 1 schematically illustrates a homogenizer which is preferably used in a device according to the invention for controlling the intensity distribution of a laser beam.

FIG. 1 illustrates a homogenizer 10 with which a laser beam 12, for example an excimer laser beam, can be homogenized. Excimer lasers emit radiation which generally has a rectangular cross-section. In the direction of the so-called long axis (of the rectangle) the energy density of the radiation has a distribution which is substantially trapezoidal with steep sides ("flat top"). In the direction of the so-called short axis (of the rectangle) the energy density of the radiation has a distribution which corresponds substantially to a so-called Gaussian curve. In FIG. 1, if one considers the short axis from the side, it extends from top to bottom. The intensity distribution is shown schematically (on a grey base).

The homogenizer 10 consists of two cylindrical lens arrays 14 and 16 arranged in parallel and a converging lens 18 (condenser lens) arranged behind them in the beam path. The longitudinal axes of the cylindrical lenses thus extend at right angles to the drawing plane. This can also be seen from the schematic representation of the cylindrical lens forms in the Figures. Thus when an excimer laser beam is used, the cylindrical axes extend in parallel to the "long axis" of the laser beam. In FIG. 1 (and also in FIG. 4) the beam path of the laser beam 12 extends from left to right. The homogenizer shown in FIG. 1 is known from the prior art described in the introduction.

The incident laser beam 12 is split into a plurality of sub-beams by the first array 14 of cylindrical lenses. FIG. 1 schematically illustrates only the beam path of three sub-beams, whereas in total the laser beam is split into seven sub-beams in this instance (5–20 sub-beams are typical).

The optical elements 14, 16 and 18 cause the laser radiation 12 incoming from the left in FIG. 1 to be focused onto a plane 20. All the sub-beams are fully superimposed in the plane 20 (they overlap). This means that inhomogeneities of the intensities still present in the incident laser beam 12 are fully compensated, i.e. the laser beam focused onto the plane 20 is homogenized. Naturally homogenization is only achieved if the incident laser beam already has a specific appearance, in particular for example is symmetrical, as is the laser beam shown here.

If the incident laser radiation is also inhomogeneous in the direction at right angles to the drawing plane, a second homogenizer, rotated by 90° relative to the diagram in FIG. 1, is required (not shown).

The cylindrical lenses of the cylindrical lens array 14 have the focal length $f_1$; the cylindrical lenses of the cylindrical lens array 16 have the focal length $f_2$; and the converging lens 18 has the focal length $f_3$. The size and shape of the illuminating field on the focusing plane 20 (square, rectangular, . . . ) is determined by the width and focal length $f_2$ of the lenses and the focal length $f_3$ of the converging lens.

Figure 2:
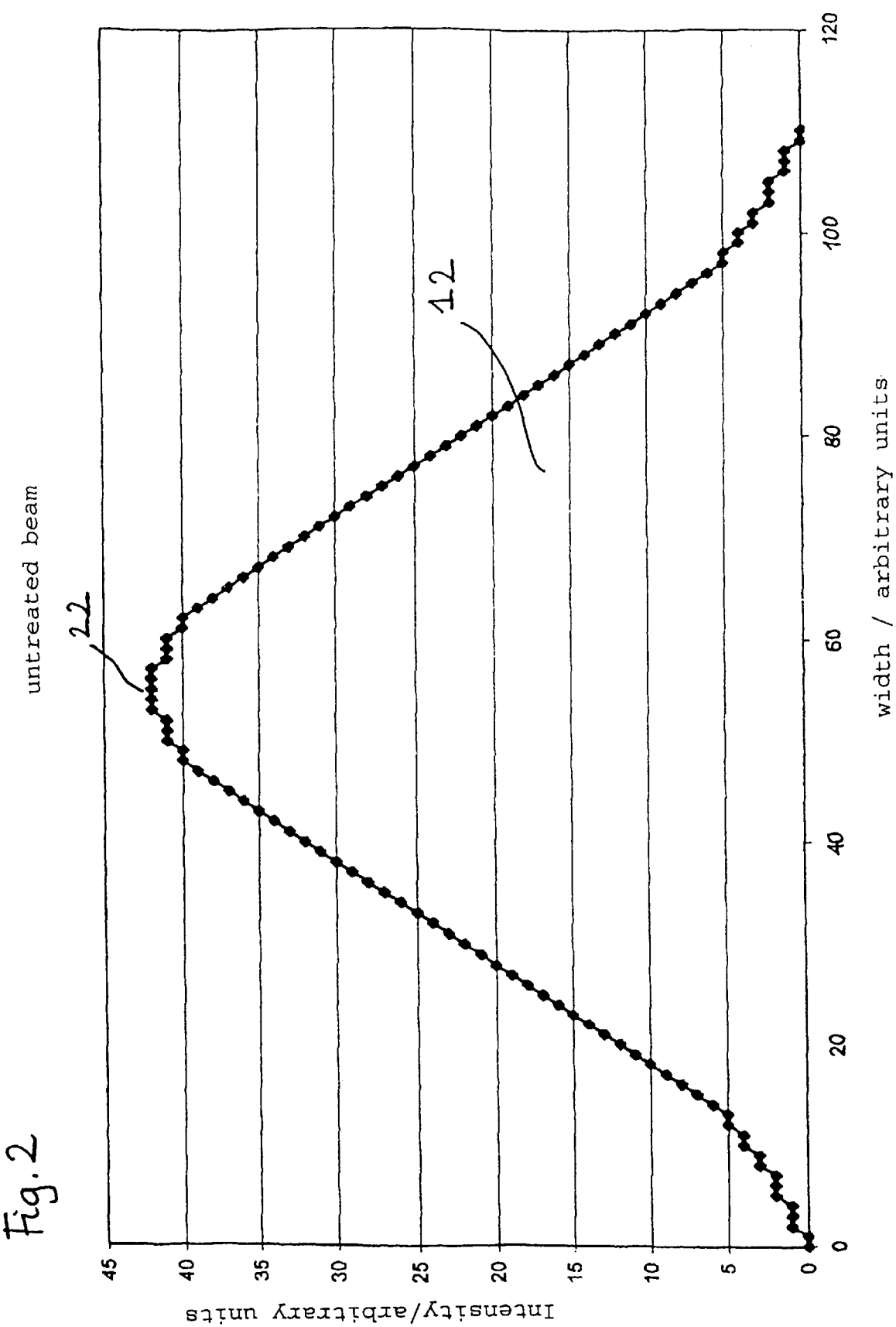
FIG. 2 illustrates the intensity distribution along an axis of an excimer laser.

FIG. 2 illustrates the intensity distribution of the irradiated laser beam 12 along the short axis. This intensity distribution is symmetrical with respect to the beam axis, firstly constantly rising to a maximum 22 from the one side of the laser beam and constantly falling from the maximum 22 to the other side. Between the individual points—here measurement points—of the curve, fluctuations in the intensity distribution can take place, but these occur on a substantially smaller scale than that shown here and therefore are not visible.

It is therefore the case that, with the intensity distributions shown in FIG. 2, all the sub-beams (except for a central sub-beam around the maximum 22) constantly rise from one side to the other (or fall depending upon what is defined as the one side and the other side).

Figure 3:
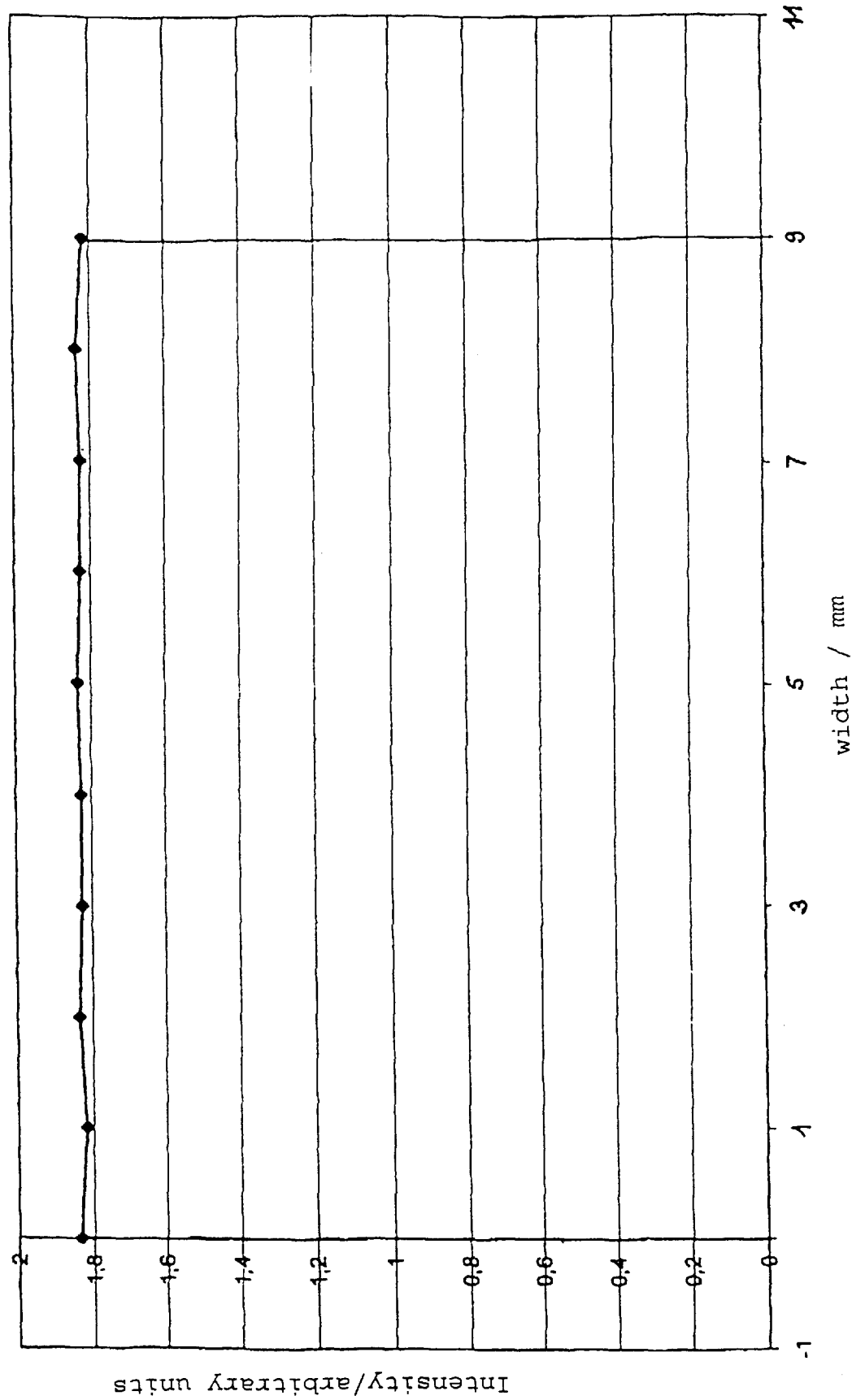
FIG. 3 illustrates a typical homogeneous intensity distribution of an excimer laser as can be obtained with the device according to FIG. 1.

As the intensity distribution according to FIG. 2 is symmetrical and as the homogenizer mutually superimposes all the sub-beams from the intensity distribution, in particular the sub-beams on the left-hand side of the maximum 22 are superimposed with the sub-beams on the right-hand side of the maximum 22, whereby an overall homogeneous beam profile is obtained. An example of a homogeneous beam profile of this kind is shown in FIG. 3. This is the beam profile which is obtained in the plane 20.

Figure 4:
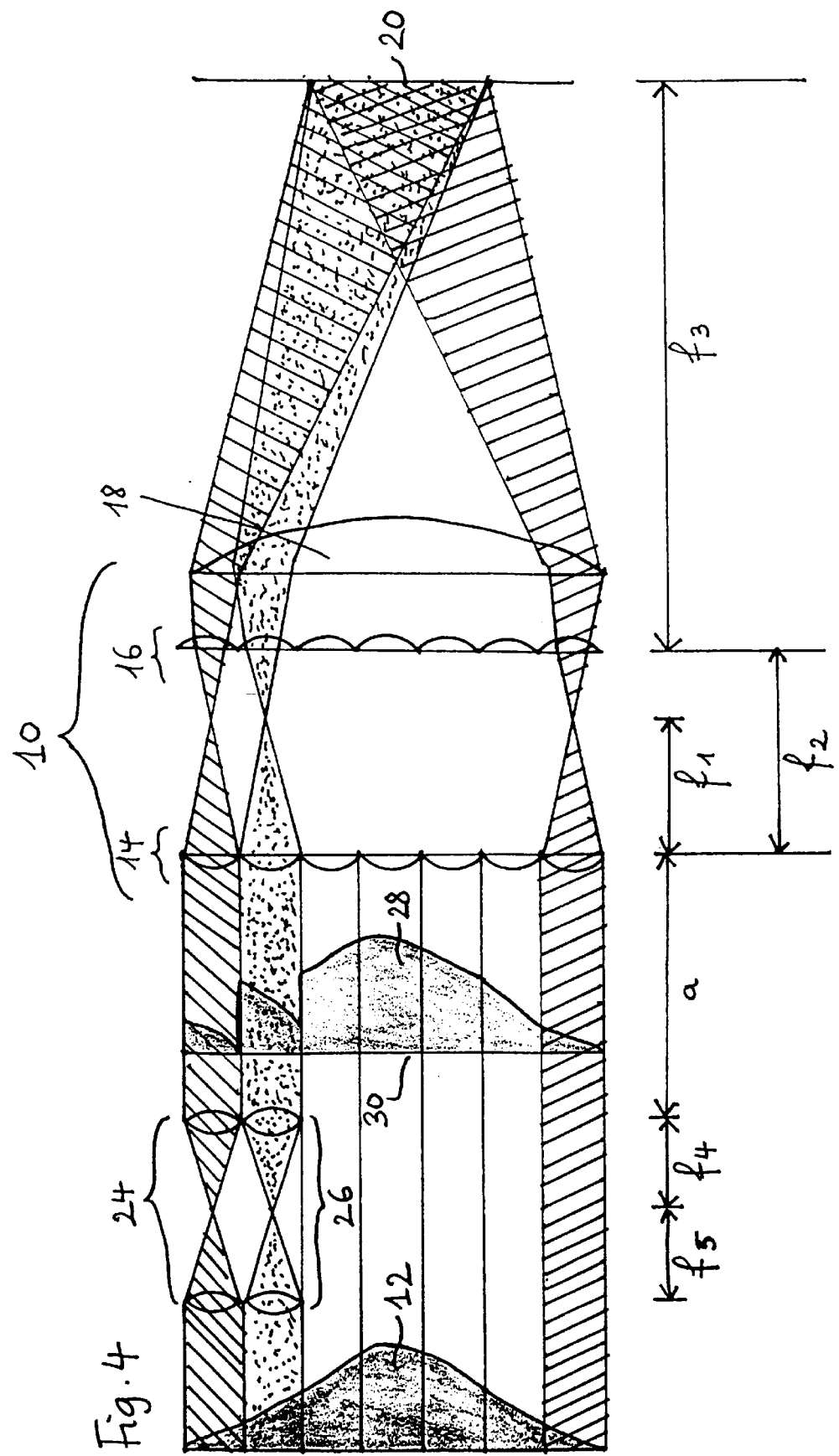
FIG. 4 illustrates a first embodiment of the device according to the invention for converting the intensity distribution of a laser beam comprising a homogenizer such as that shown in FIG. 1 and two inverters.

FIG. 4 illustrates a device according to the invention for converting the intensity distribution of a laser beam. This consists of the homogenizer 10 and two inverters 24 and 26 arranged in front of the homogenizer in the direction of incidence of the laser beam 12. The inverters 24 and 26 each consist of two converging lenses, where the first converging lens has the focal length $f_5$ and the second converging lens has the focal length $f_4$, and the two converging lenses are spaced from one another by the distance $f_5+f_4$. Preferably, as shown here, $f_5=f_4$. Along the short axis, which here extends from the top, each converging lens has the same size as one of the lenses of the cylindrical lens array 14 and is in each case arranged such that it precisely acts on or focuses the sub-beam which impinges on a corresponding cylindrical lens of the cylindrical lens array 14. Alternatively, the converging lenses of each inverter 24 and 26 can also be somewhat smaller than the lenses of the cylindrical lens array 14 so that not the entire sub-beam, focused by the corresponding cylindrical lens of the cylindrical lens array 14, is inverted. The converging lenses for the inverters 24 and 26 can for example be 10% smaller than the corresponding lenses of the cylindrical lens array 14 in the direction extending from top to bottom in FIG. 4.

FIG. 4 schematically illustrates the beam path of the two sub-beams which are inverted by the inverters 24 and 26, and of a further sub-beam which is not additionally inverted. The first converging lens of each inverter 24 and 26 inverts the corresponding sub-beam. The second converging lens serves to redirect the already inverted sub-beam into the direction of the beam propagation, i.e. a beam impinging in parallel on the first lens issues in parallel from the second lens.

The distance between the second converging lens of each inverter and the plane of the cylindrical lens array 14, which is referenced a in FIG. 4, is distinctly larger than the focal lengths $f_5$ and $f_4$ in FIG. 4. However, in accordance with an alternative embodiment, the distance a can also be selected such that $a=f_4$.

The intensity distribution 28, which the laser beam possesses in the plane 30 behind the two inverters 24 and 26, is schematically illustrated in FIG. 4 (on a grey base).

In the profile 28 two sub-beams are inverted, i.e. instead of the intensity rising constantly from one side (at the top) to the other side (at the bottom), the profile falls constantly. Consequently in the plane 20 the sub-beams are superimposed such that a laser beam is generated in which the intensity distribution appears such that the intensity constantly falls from one side (at the bottom) to the other side (at the top).

Figure 5:
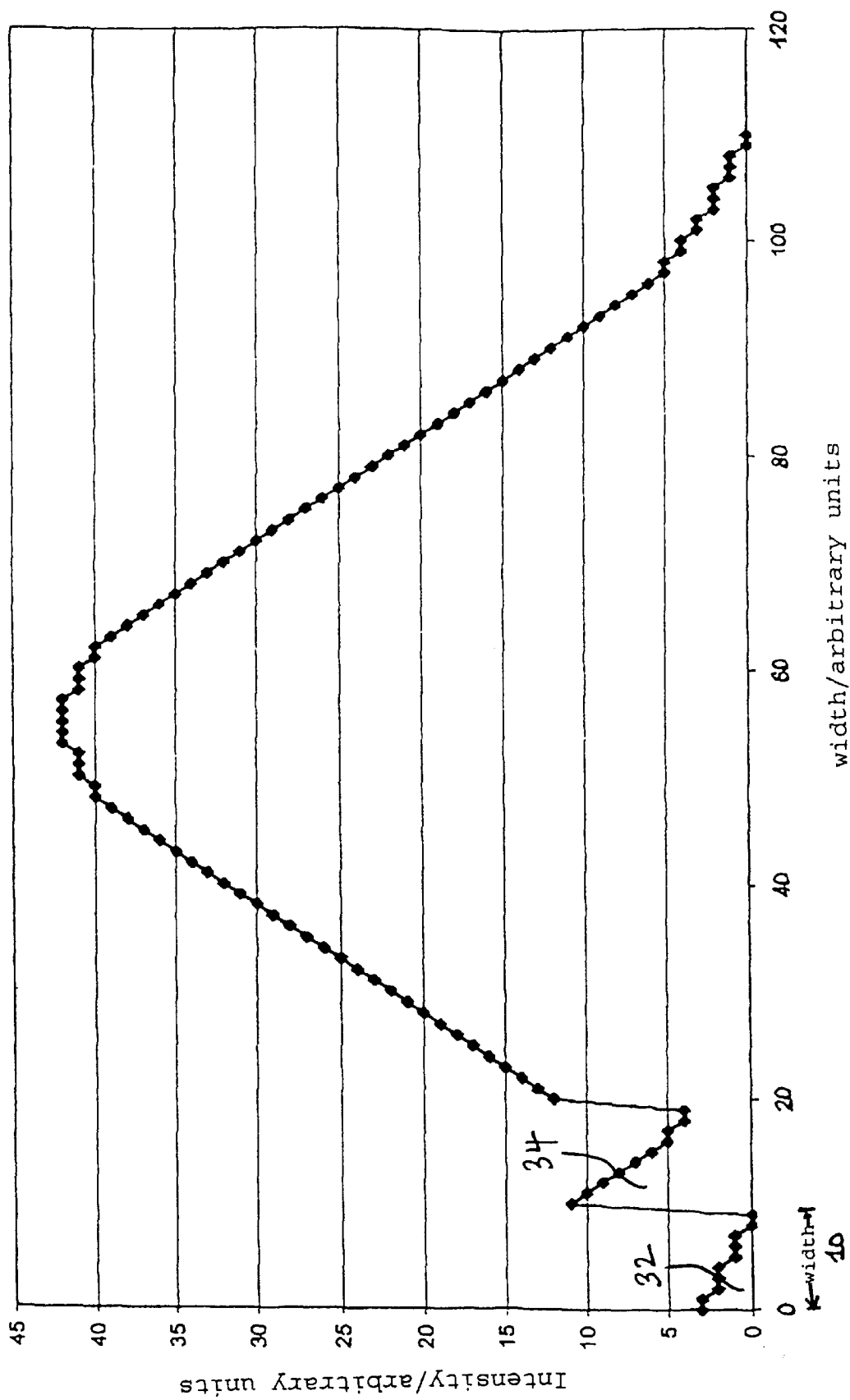
FIG. 5 illustrates the intensity distribution of the laser beam according to FIG. 2 when the beam has passed through the two inverters shown in FIG. 4.

An intensity distribution as obtained in accordance with the present invention, for example in the plane 30, is shown in FIG. 5. (Here however the laser beam was split into more than only seven sub-beams).

Here two sub-beams 32 and 34, each having a width of ten arbitrary units, have been inverted. Here the inversion means for example that the intensity which the laser beam possessed at the width point 11 before the inversion now occurs at the width point 19, while the intensity which existed at the width 12 before the inversion now occurs at the width 18 etc. The sub-beam 32 thus arises as a result of a reflection of the values of the corresponding sub-beam according to FIG. 2 on an axis extending through the width 5, while the sub-beam 34 arises from the values of the corresponding sub-beam according to FIG. 2 when they are reflected on an axis extending through the width 15.

If a beam with an intensity distribution corresponding to that shown in FIG. 5 is passed through a homogenizer such as that shown in FIG. 1, an inhomogeneous beam profile is obtained in which the intensity distribution falls constantly from one side to the other. If, in contrast to the homogenizer shown in FIG. 1 and FIG. 4, the sub-beams are not inverted once again, an intensity distribution such as that shown in FIG. 6 is obtained.

As already mentioned in the introduction, beams with an intensity distribution of this kind are used advantageously for example for the recrystallisation of amorphous Si-layers for a homogeneous recrystallisation. In such a case the laser beam is guided over substrates comprising amorphous Si-layers, such that the layers are firstly impinged upon by the part of the laser beam on the left-hand side of FIG. 6, thus the part with the increase in intensity, and upon the passage of the laser beam over the substrate the laser power then gradually decreases.

Figure 6:
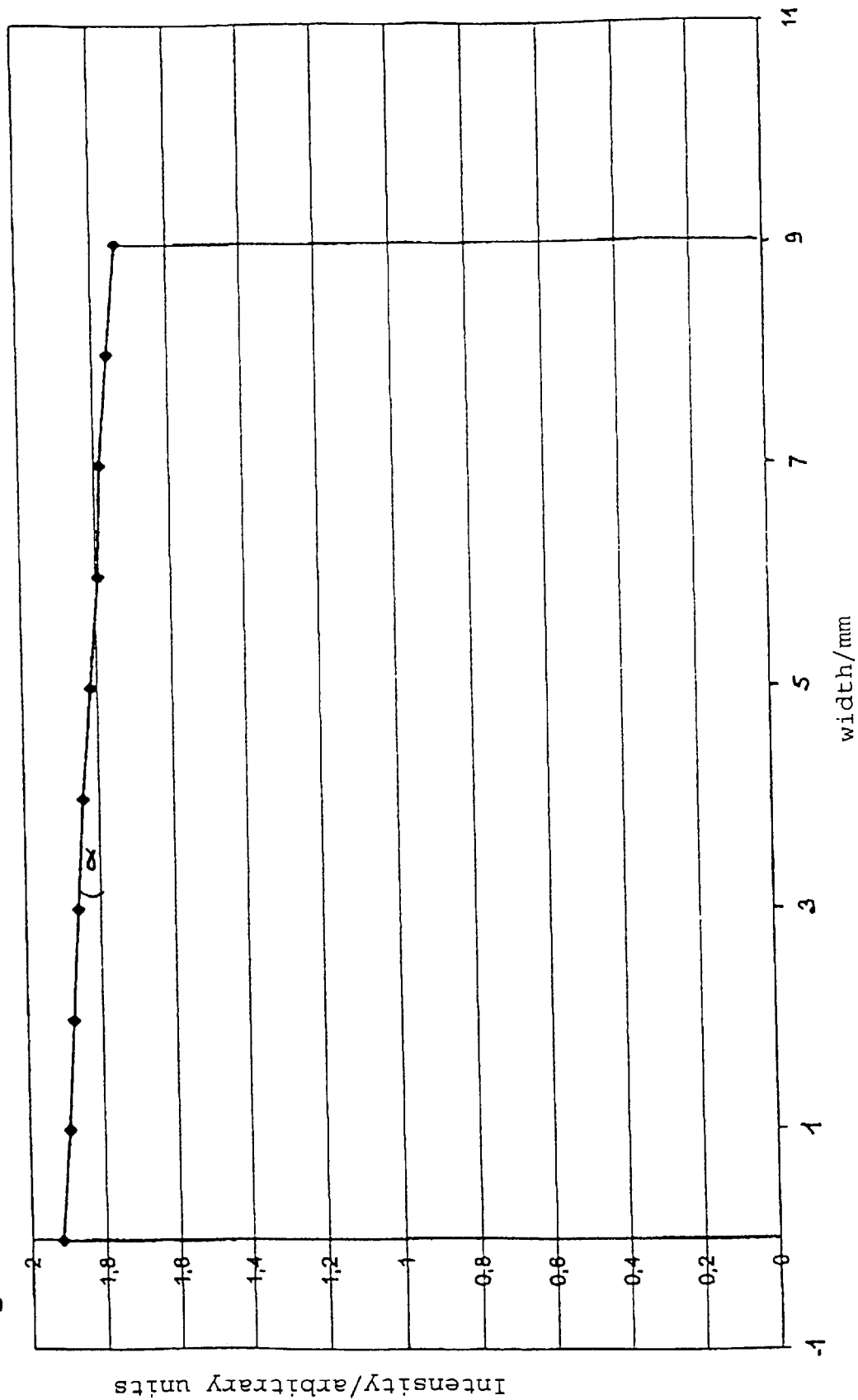
FIG. 6 illustrates the inhomogeneous intensity distribution obtained by means of the device according to the invention as shown in FIG. 4, in the case of which the intensity constantly falls along the axis shown here from the one side to the other and which is acquired if the laser beam with the intensity distribution according to FIG. 5 passes through the homogenizer shown in FIG. 4 (and FIG. 1)

The angle α shown in FIG. 6 can be adjusted by appropriately selecting the number of inverted sub-beams (or their size).

In the embodiment shown in FIG. 4, the inverters 24 and 26 are arranged in front of the homogenizer 10. However they can also be incorporated therein, for example in that the two upper lenses in FIG. 4 of the cylindrical lens array 14 are replaced by lenses with a distinctly smaller focal length, and with two further lenses having a short focal length in each case incorporated into the beam path, for example between the cylindrical lens array 14 and the cylindrical lens array 16 for the two upper sub-beams.

An alternative embodiment of the device according to the invention is shown in FIG. 7. The main components of this device are identical to those in the embodiment illustrated in FIG. 4 and have been provided with the same reference numerals. Here however in place of two inverters 24 and 26, only one single inverter 35 is provided, which is formed by converging lenses 36 and 38 and which inverts not only one single sub-beam but a total of two adjacent sub-beams. In contrast to FIG. 4, in this way it is not the intensity distribution in each individual sub-beam which is rotated, but the intensity distribution of the total of the two sub-beams. The intensity distribution 40, which the laser beam possesses in the plane 30 behind the inverter 35, is schematically illustrated in FIG. 7 (on a grey base) and the inverted part of the intensity distribution has been referenced 42. By comparison with FIG. 4 it can be seen that relative to FIG. 4 the two sub-beams are transposed behind the inverter 35 in FIG. 7. As the homogenizer 10 homogeneously superimposes all the sub-beams, this does not however in any way change the intensity distribution which results in the plane 20. Also in the embodiment according to FIG. 7, one thus obtains the intensity distribution shown in FIG. 6.

In the embodiment shown in FIG. 7, the inverter 35 is arranged in front of the homogenizer 10. However it can also be incorporated therein, for example in that the two upper lenses in FIG. 7 of the cylindrical lens array 14 are replaced by lenses with a distinctly smaller focal length, and where lenses corresponding to the lenses 36 and 38 but having a short focal length are incorporated into the beam path for example between the cylindrical lens array 14 and the cylindrical lens array 16 for the two upper sub-beams.

In another alternative, only one single converging lens, which for example is arranged shortly in front of the homogenizer or is incorporated therein, serves to invert a sub-beam.

What is claimed is:

1. A device for converting an intensity distribution of a laser beam, comprising:

a homogenizer comprising at least one lens array which produces multiple sub-beams of an incident laser beam, the homogenizer mutually superimposing the sub-beams of the laser beam, such that when a laser beam with a specific intensity distribution passes through the homogenizer, a homogenization of the intensity distribution of the laser beam is promoted, and at least one inverter which inverts the intensity distribution of a sub-region of the laser beam along at least one axis along which the intensity is to be converted.

2. A device according to claim 1, wherein the sub-region of the laser beam is one of the sub-beams which is superimposed with other sub-beams by the homogenizer.

3. A device according to claim 1, wherein the sub-region of the laser beam comprises a group of two or more adjacent sub-beams which are superimposed by the homogenizer.

4. A device according to claim 1, wherein the inverter comprises two converging lenses which are spaced from one another by the sum of their focal lengths in a direction of beam propagation.

5. A device according to claim 1, wherein the inverter is arranged in front of the homogenizer in a direction of beam propagation.

6. A device for converting an intensity distribution of a laser beam, comprising:

a homogenizer which mutually superimposes sub-beams of the laser beam, such that when a laser beam with a specific intensity distribution passes through the homogenizer, a homogenization of the intensity distribution of the laser beam is promoted, and at least one inverter which inverts the intensity distribution of a sub-region of the laser beam along at least one axis along which the intensity is to be converted, wherein the inverter com rises two converging lenses which are spaced from one another by the sum of their focal lengths in a direction of beam propagation.

7. A device for converting an intensity distribution of a laser beam, comprising:

a homogenizer which mutually superimposes sub-beams of the laser beam, such that when a laser beam with a specific intensity distribution passes through the homogenizer, a homogenization of the intensity distribution of the laser beam is promoted, and at least one inverter which inverts the intensity distribution of a sub-region of the laser beam along at least one axis along which the intensity is to be converted, wherein the inverter is arranged in front of the homogenizer in a direction of beam propagation.

8. A device for converting an intensity distribution of a laser beam, comprising:

a plurality of optical appliances; and a converging lens arranged behind said appliances, and wherein the appliances are selected and arranged such that each optical appliance focuses a sub-beam of the laser beam, and that having passed through the device the sub-beams are mutually superimposed, and wherein at least one of the optical appliances is designed such that along at least one axis, along which the intensity is to be converted, said at least one optical appliance inverts the associated sub-beam once more than the other optical appliances each invert their respective sub-beams.

9. A device according to claim 8, wherein the other optical appliances each comprise a pair of lenses, and each optical appliance which inverts the associated sub-beam once more than the other optical appliances invert their respective associated sub-beam comprises two pairs of lenses.

10. A device for generating a laser beam with an intensity which constantly falls along an axis from one side to the other, comprising:
  a laser beam source which generates a laser beam in which the intensity in specific sub-regions of the laser beam constantly rises along the axis from one side of the specific sub-regions to the other side;
  at least one inverter which inverts the intensity distribution at least of one of the specific sub-regions of the laser beam along the axis; and
  a homogenizer which mutually superimposes sub-beams of the laser beam such that the laser beam would be homogenized if none of its sub-beams were to pass through the inverter.

11. A device according to claim 10, wherein the at least one sub-region of the laser beam is one of the sub-beams which is superimposed with other sub-beams by the homogenizer.

12. A device according to claim 10, wherein the at least one sub-region of the laser beam comprises a group of two or more adjacent sub-beams which are superimposed by the homogenizer.

13. A device according to claim 10, wherein the laser beam source generates a laser beam whose intensity firstly constantly rises to a maximum from one side of the laser beam along the axis and constantly falls from the maximum towards the other side.

14. A device according to claim 13, wherein the laser beam source generates a laser beam with a substantially symmetrical intensity distribution.

15. A device according to claim 10, wherein the laser beam source generates a laser beam with an intensity distribution which is bell-shaped along an axis.

16. A device according to one of claims 10–15 wherein the inverter comprises two converging lenses which are spared from one another by the the sum of their focal lengths in the direction of beam propagation.

17. A device according to claim 16, wherein the inverter is arranged in front of the homogenizer in the direction of beam propagation.

18. A method of generating a laser beam with an intensity which constantly falls along its axis from one side to the other, comprising the following steps:
  generating a laser beam in which the intensity in specific sub-regions of the laser beam constantly rises along the axis from one side of the specific sub-regions to the other side;
  inverting at least one of the specific sub-regions of the laser beam along the axis;
  passing the laser beam through a homogenizer which mutually superimposes sub-beams of the laser beam such that without inverting the at least one of the specific sub-beams, a homogenization of the intensity distribution would be promoted.

19. A method according to claim 18, wherein the at least one sub-region of the laser beam is one of the sub-beams which is superimposed with other sub-beams by the homogenizer.

20. A method according to claim 18, wherein the at least one sub-region of the laser beam comprises a group of two or more adjacent sub-beams which are superimposed by the homogenizer.

21. A method according to claim 18, wherein the step of inverting the at least one sub-region takes place before the laser beam passes through the homogenizer.

22. A method according to claim 18, wherein a laser beam is irradiated which, along the axis, has a bell-shaped intensity distribution with a maximum and wherein inversion takes place only of sub-regions lateral the maximum on one of the two sides.

23. A method according to claim 18, wherein the extent of the constant fall in intensity is controlled by the number of specific sub-beams which are inverted.

24. A method of recrystallising a silicon layer, wherein a laser beam is guided relative to the silicon layer across a cross-section of the beam beginning with a leading edge through following parts of the beam including a trailing edge, wherein the leading edge of the laser beam has a higher intensity than the following parts of the laser beam including the trailing edge.

25. A method as in claim 24, wherein the intensity of the beam gradually decreases through the cross-section from the leading edge through the following parts including the trailing edge.

* * * * *